United States Patent
Sugihara et al.

(10) Patent No.: US 7,170,109 B2
(45) Date of Patent: Jan. 30, 2007

(54) HETEROJUNCTION SEMICONDUCTOR DEVICE WITH ELEMENT ISOLATION STRUCTURE

(75) Inventors: Kohei Sugihara, Tokyo (JP); Kazunobu Ota, Tokyo (JP); Hidekazu Oda, Tokyo (JP); Takahashi Hayashi, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 49 days.

(21) Appl. No.: 10/864,457

(22) Filed: Jun. 10, 2004

(65) Prior Publication Data

US 2004/0256634 A1 Dec. 23, 2004

(30) Foreign Application Priority Data

Jun. 13, 2003 (JP) ............................. 2003-169288

(51) Int. Cl.
*H01L 31/072* (2006.01)
*H01L 31/109* (2006.01)
*H01L 31/0328* (2006.01)
*H01L 31/0336* (2006.01)
*H01L 23/48* (2006.01)

(52) U.S. Cl. .......................... 257/192; 257/20; 257/24; 257/93; 257/193; 257/194; 257/200; 257/201; 257/339; 257/348; 257/349; 257/374; 257/392; 257/402; 257/409; 257/446; 257/499; 257/500; 257/501; 257/502; 257/503; 257/504; 257/505; 257/506; 257/507; 257/508; 257/509; 257/510; 257/513; 257/524; 257/527

(58) Field of Classification Search .................. 257/93, 257/374, 446, 499–510, 513, 524, 20, 24, 257/192, 194–196, 200–201, 339, 348–349, 257/392, 402, 409, 547, 758–760
See application file for complete search history.

(56) References Cited

U.S. PATENT DOCUMENTS 4,571,512 A * 2/1986 Schutten et al. ............ 327/389

(Continued)

FOREIGN PATENT DOCUMENTS

JP 11-233610 8/1999

OTHER PUBLICATIONS

Kem Rim, et al., "Fabrication and Analysis of Deep Submicron Strained-Si N-MOSFET's", IEEE Transactions on Electron Devices, vol. 47, No. 7, Jul. 2000.

(Continued)

*Primary Examiner*—Ida M. Soward
(74) *Attorney, Agent, or Firm*—McDermott Will & Emery LLP

(57) ABSTRACT

A technique enabling to improve element isolation characteristic of a semiconductor device is provided. An element isolation structure is provided in a semiconductor substrate in which a silicon layer, a compound semiconductor layer and a semiconductor layer are laminated in this order. The element isolation structure is composed of a trench, a semiconductor film, and first and second insulating films. The trench extends through the semiconductor layer and extends to the inside of the compound semiconductor layer. The semiconductor film is provided on the surface of the trench, and the first insulating film is provided on the semiconductor film. The second insulting film is provided on the first insulating film and fills the trench. Since the semiconductor film is interposed between the compound semiconductor film which is exposed by the trench and the first insulating film, there is no possibility that the compound semiconductor layer is directly thermally oxidized even if the semiconductor film is thermally oxidized to form the first insulating film.

3 Claims, 13 Drawing Sheets

U.S. PATENT DOCUMENTS

| | | | | |
|---|---|---|---|---|
| 4,574,207 | A | * | 3/1986 | Benjamin et al. ............ 327/389 |
| 4,612,465 | A | * | 9/1986 | Schutten et al. ............ 327/434 |
| 4,796,070 | A | * | 1/1989 | Black ......................... 257/328 |
| 5,177,576 | A | * | 1/1993 | Kimura et al. ................. 257/71 |
| 5,266,813 | A | * | 11/1993 | Comfort et al. .............. 257/19 |
| 5,428,236 | A | * | 6/1995 | Uchida ....................... 257/305 |
| 5,675,173 | A | * | 10/1997 | Kawai et al. ............... 257/508 |
| 5,691,550 | A | * | 11/1997 | Kohyama ................... 257/301 |
| 5,731,609 | A | * | 3/1998 | Hamamoto et al. ......... 257/302 |
| 5,976,936 | A | * | 11/1999 | Miyajima et al. ........... 438/268 |
| 6,020,600 | A | * | 2/2000 | Miyajima et al. ............. 257/76 |
| 6,396,107 | B1 | * | 5/2002 | Brennan et al. ............ 257/362 |
| 6,461,925 | B1 | * | 10/2002 | John et al. .................. 438/309 |
| 6,861,316 | B2 | * | 3/2005 | Hara et al. .................. 438/285 |
| 6,956,259 | B2 | * | 10/2005 | Akasaka ..................... 257/301 |
| 2003/0042504 | A1 | * | 3/2003 | Azam et al. ................. 257/197 |
| 2003/0227061 | A1 | * | 12/2003 | Yokogawa et al. ......... 257/379 |
| 2004/0097049 | A1 | * | 5/2004 | Kawai ........................ 438/314 |
| 2004/0164373 | A1 | * | 8/2004 | Koester et al. .............. 257/499 |

OTHER PUBLICATIONS

K. Ismail, "Si/SiGe High-Speed Field-Effect Transistors", Electron Devices Society of IEEE, Technical Digest, Washington DC, pp. 509-512, Dec. 10-13, 1995.

J. Alieu, et al., "Multiple SiGe Well: A New Channel Architecture for Improving Both NMOS and PMOS Performances", Symp. VLSI Tech. Digest, 2000, pp. 130, 131.

D. K. Nayak, et al., "Interface Properties of Thin Oxides Grown on Strained $Ge_xSi_{1-x}$ Layer" J. Appl. Phys. vol. 76, No. 2, Jul. 15, 1994, pp. 982-988.

* cited by examiner

HETEROJUNCTION SEMICONDUCTOR DEVICE WITH ELEMENT ISOLATION STRUCTURE

BACKGROUND OF THE INVENTION

1. Field of the Invention

The present invention relates to a semiconductor device provided with an element isolation structure.

2. Description of the Background Art

Recently, it is becoming increasingly difficult to improve the driving capability of a MOS transistor formed in a silicon substrate, which is the most important for achieving high operating speed of a CMOS device. As a technique for overcoming this, there has been proposed a method for forming a MOS transistor by utilizing heterojunction to be formed by silicon (Si) and silicon germanium (SiGe).

Based on the document of Kern (Kim) Rim et al., "Fabrication and Analysis of Deep Submicron Strained-Si N-MOSFET's," IEEE Transactions on Electron Devices, 2000, Vol. 47, No. 7, pp. 1406–1415 (hereinafter referred to as a "document I"), a silicon germanium layer (hereinafter referred to as a "SiGe layer") after being subjected to lattice relaxation is formed on a silicon substrate, and a silicon layer (hereinafter referred to as a "Si layer") is formed on the SiGe layer while subjecting it to lattice matching. As a result, the Si layer has tensile strain. This Si layer having tensile strain is hereinafter referred to as a "strained Si layer". A MOS transistor that utilizes the strained Si layer as a channel (hereinafter referred to as a "strained Si channel MOS transistor") has higher electron mobility and hole mobility in an inversion layer than a MOS transistor that utilizes a strain-free Si layer as a channel. Therefore, employment of the strained Si channel MOS transistor as a MOS transistor enables to improve the driving capability of the MOS transistor and the operating speed of a CMOS device.

Additionally, the document of K. Ismail, "Si/SiGe High-Speed Field-Effect Transistors," International Electron Devices Meeting Technical Digest, 1995, pp. 509–512 (hereinafter referred to as a "document II"), proposes a CMOS device that has a modulation dope type n-channel MOS transistor and a p-channel MOS transistor. In the n-channel MOS transistor, an intrinsic strained Si layer into which no impurity is introduced is formed on a SiGe layer into which n-type impurity is introduced, and the strained Si layer is used as a channel. In the p-channel MOS transistor, a strain Si layer free from impurity is formed on a SiGe layer into which no impurity is introduced, and the SiGe layer is used as a channel.

In the CMOS device proposed in the document II, no impurity is introduced into the channel in both of the n-channel MOS transistor and the p-channel MOS transistor. Further, the SiGe layer can obtain higher hole mobility than the strained Si layer. Accordingly, the CMOS device of the document II can improve its operating speed than the CMOS device in which both of the n-channel MOS transistor and the p-channel MOS transistor use the strained Si layer as a channel layer.

Also, a CMOS device utilizing superlattice formed by Si and SiGe as a channel is proposed in the document of J. Alieu et al., "Multiple SiGe well: a new channel architecture for improving both NMOS and PMOS performances," Symp. VLSI Tech. Digest, 2000, p. 130, 131 (hereinafter referred to as a "document III").

Thus, the currently proposed CMOS devices utilizing heterojunction for channel employ a compound semiconductor layer such as a SiGe layer or a silicon germanium carbon layer (hereinafter referred to as a "SiGeC layer"). The document of D. K. Nayak et al., "Interface properties of thin oxides grown on strained $Ge_xSi_{1-x}$ layer," J. Appl. Phys., 1994, Vol. 76, No. 2, pp. 982–988 (hereinafter referred to as a "document IV"), describes the phenomenon that occurs during thermal oxidization of a SiGe layer. Further, Japanese Patent Application Laid-Open No. 11-233610 discloses a technique related to an element isolation structure for separating between semiconductor elements.

In the document IV, there is reported the phenomenon that if a silicon oxide film is formed by thermally oxidizing a SiGe layer, germanium is discharged from the silicon oxide film, and germanium segregates in the interface between the SiGe layer and the silicon oxide film, thereby increasing the interface state density in the interface and the fixed charge in the silicon oxide film.

On the other hand, in trench isolation structure that is dominant of element isolation structure in current semiconductor devices, after forming a trench in a silicon substrate, the inner surface of the exposed silicon substrate is thermally oxidized to form a thermal oxide film on the surface of the trench, and the trench is then filled with an insulating film.

If the trench is filled with the insulating film, without thermally oxidizing the surface of the trench, the interface state density between the insulating film and the silicon substrate is increased. Therefore, in order to suppress this increase to reduce the leakage current of a semiconductor element, the thermal oxide film is formed on the surface of the trench.

In the case where trench isolation structure is employed in a semiconductor device utilizing the above-mentioned heterojunction, an upper-layer strained Si layer has a small film thickness, so that the SiGe layer and the SiGeC layer are exposed by a trench of the trench isolation structure. Therefore, the exposed SiGe layer and the SiGeC layer are thermally oxidized. In the interface between a compound semiconductor layer containing germanium such as the SiGe layer, and the thermal oxide film of the trench isolation structure, the germanium segregates thereby to increase the interface state density in that interface, and increase the fixed charge in the thermal oxide film. As a result, the element isolation characteristic in the semiconductor device might be lowered.

SUMMARY OF THE INVENTION

The present invention has for its object to provide a technique with which it is capable of reducing the leakage current of a semiconductor element and improving the element isolation characteristic of a semiconductor device.

A semiconductor device of the present invention includes a semiconductor substrate, an element isolation structure, and a semiconductor element. The semiconductor substrate has a compound semiconductor layer, and a semiconductor layer that is provided on the compound semiconductor layer and forms heterojunction with the compound semiconductor layer. The element isolation structure is provided in the semiconductor substrate and defines an element forming region in the semiconductor substrate. The semiconductor element is provided in the element forming region. The element isolation structure has a trench, a first semiconductor film, and first and second insulating films. The trench extends through the semiconductor layer in the direction of thickness thereof, and extends to the inside of the compound semiconductor layer. The first semiconductor film is provided on a surface of the trench. The first insulating film is provided on the first semiconductor film. The second insulating film is provided on the first insulating film and fills the trench.

Since the first insulating film is provided on the first semiconductor film formed on the surface of the trench, it is possible to suppress the compound semiconductor layer exposed by the trench from being directly oxidized even if the first semiconductor film is thermally oxidized to form the first insulting film. Therefore, even if an element such as germanium is contained in the compound semiconductor layer, it is possible to suppress the element from segregating in the interface between a semiconductor region including the semiconductor layer, the compound semiconductor layer and the first semiconductor film, and an insulator region including the first and second insulating films. As a result, it is capable of suppressing an increase in the interface state density in the interface between the semiconductor region and the insulator region, thereby reducing the leakage current of the semiconductor element provided in the element forming region. It is also capable of suppressing an increase in the fixed charge in the first insulating film, thereby improving the element isolation characteristic in the semiconductor device.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 20 to 23 are sectional views showing a method for manufacturing a semiconductor device according to a fourth preferred embodiment of the present invention;

FIG. 24 is a sectional view showing the structure of a semiconductor device according to a fifth preferred embodiment of the present invention.

DESCRIPTION OF THE PREFERRED EMBODIMENTS

First Preferred Embodiment

Figure 1:
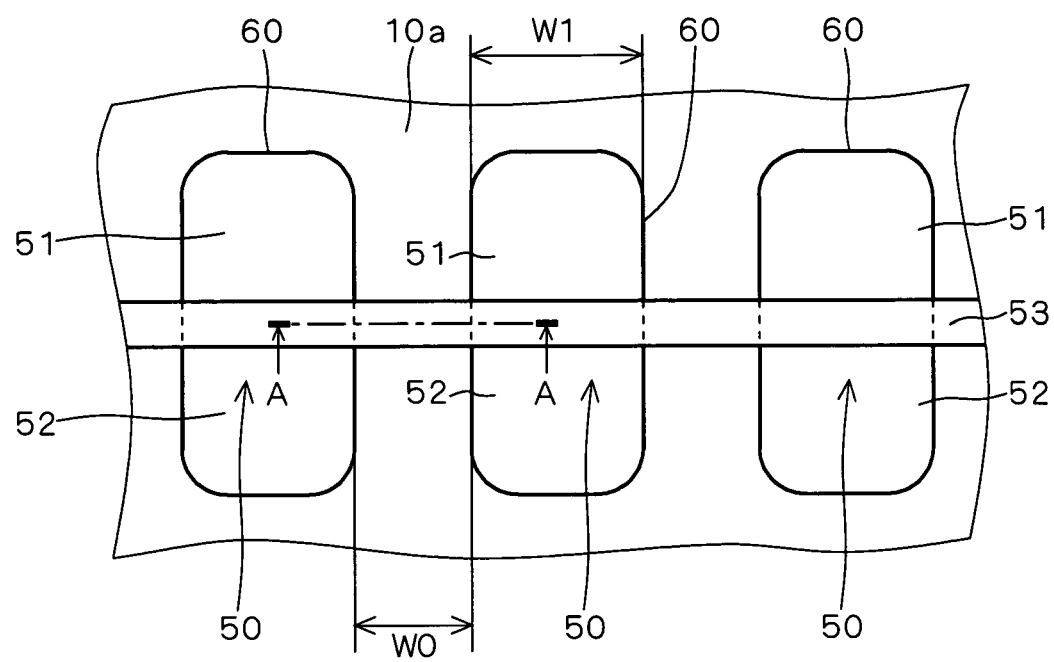
FIG. 1 is a plan view showing the structure of a semiconductor device according to a first preferred embodiment of the present invention.
Figure 2:
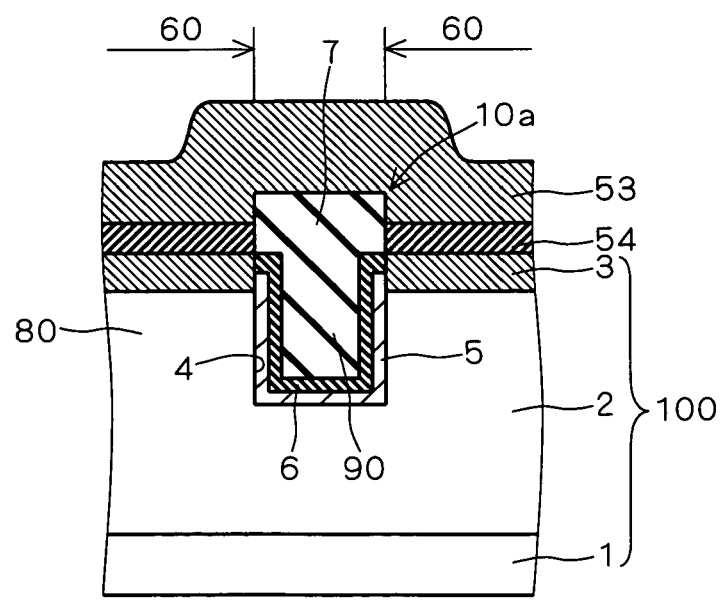
FIG. 2 is a sectional view showing the structure of the semiconductor device of the first preferred embodiment.

FIG. 1 is a plan view showing the structure of a semiconductor device according to a first preferred embodiment of the present invention. FIG. 2 is a sectional view taken along the line A—A as indicated by the arrows in FIG. 1. As shown in FIGS. 1 and 2, the semiconductor device of the first preferred embodiment has a semiconductor substrate 100. The semiconductor substrate 100 has a silicon substrate 1, a compound semiconductor layer 2, and a semiconductor layer 3. The compound semiconductor layer 2 is a SiGe layer, for example. The semiconductor layer 3 is a Si layer, for example. The silicon substrate 1, the compound semiconductor layer 2 and the semiconductor layer 3 are laminated in this order, and the compound semiconductor layer 2 and the semiconductor layer 3 form heterojunction. As a result, the semiconductor layer 3 becomes a strained Si layer.

An element isolation structure 10a is formed in the semiconductor substrate 100, and a plurality of element forming regions 60 are defined in the semiconductor substrate 100 by the element isolation structure 10a. A MOS transistor 50 is formed in each of the element forming regions 60. The MOS transistor 50 is, for example, a strained Si channel MOS transistor employing the semiconductor 3 as a channel.

The element isolation structure 10a is provided with a trench 4, a semiconductor film 5, and insulating films 6 and 7. The trench 4 extends through the semiconductor layer 3, and extends to the inside of the compound semiconductor layer 2. In the first preferred embodiment, the trench 4 does not extend through the compound semiconductor layer 2.

The semiconductor film 5 is provided on the surface of the trench 4 and in contact with the entire region of the inner surface of the compound semiconductor layer 2 exposed by the trench 4, and also in partially contact with the inner side surface of the semiconductor layer 3 exposed by the trench 4. Not only the semiconductor layer 3 but also the semiconductor film 5 has tensile strain.

The insulating film 6 is provided on the semiconductor film 5 and in contact with part making no contact with the semiconductor film 5 in the semiconductor layer 3 exposed by the trench 4.

The insulating film 7 is provided on the insulating film 6 and fills the trench 4. The semiconductor film 5 is composed of a silicon film, for example. The insulating films 6 and 7 are composed of a silicon oxide film, for example.

A source region 51 and a drain region 52 of the MOS transistor 50 are provided in the upper surface of the semiconductor substrate 100. The source region 51 and the drain region 52 extend through the semiconductor layer 3 and reach the inside of the compound semiconductor layer 2. A gate electrode 53 of the MOS transistor 50 is formed, via a gate insulating film 54, on the upper surface of the semiconductor layer 3 sandwiched between the source region 1 and the drain region 52. The gate electrode 53 is also provided on the element isolation structure 10a between the element forming regions 60.

The semiconductor device of the first preferred embodiment has an isolation width W0. The isolation width W0 is the distance between the adjacent element forming regions 60, when viewed from above, and also the width of the trench 4 between the element forming regions 60. The MOS transistor 50 also has a design channel width W1. The channel current of the MOS transistor 50 flows up and down of the sheet as seen in FIG. 1, and flows in a direction vertical to the sheet as seen in FIG. 2.

Thus, in the semiconductor device of the first preferred embodiment, the insulating film 6 is provided on the semiconductor film 5 formed on the surface of the trench 4, so that the semiconductor film 5 is interposed between the compound semiconductor layer 2 which is exposed by the trench 4 and the insulating film 6. Therefore, even if the semiconductor film 5 is thermally oxidized to form the insulating film 6, it is capable of suppressing the compound semiconductor layer 2 exposed by the trench 4 from being directly oxidized. Accordingly, even if an element such as germanium is contained in the compound semiconductor layer 2, it is capable of suppressing the element from segregating in the interface between a semiconductor region 80 including the semiconductor layer 3, the compound semiconductor layer 2 and the semiconductor film 5, and an insulator region 90 including the insulating films 6 and 7. As a result, it is capable of suppressing an increase in the interface state density in the interface between the semiconductor region 80 and the insulator region 90, thereby reducing the leakage current of the MOS transistor 50.

It is further capable of suppressing an increase in the fixed charge in the insulating film 6, thereby improving the element isolation characteristic in the semiconductor device.

Figure 3:
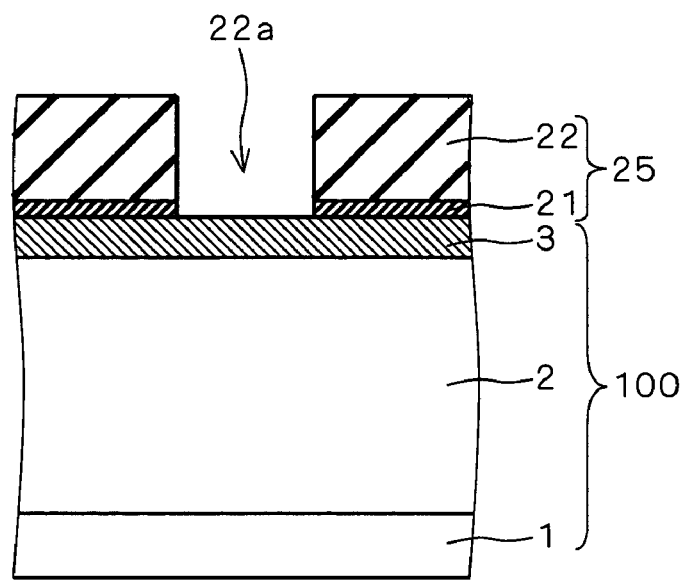
FIGS. 3 to 8 are sectional views showing a method for manufacturing a semiconductor device in the first preferred embodiment.

Description will next be made of a method for manufacturing the semiconductor device shown in FIGS. 1 and 2. FIG. 3 to 8 are sectional views at a location corresponding to the line A—A as indicated by the arrows in FIG. 1, showing in the order of the steps a method for manufacturing a semiconductor device according to the first preferred embodiment. Referring to FIG. 3, a protection film 25 composed of a thermal oxide film 21 and a silicon nitride film 22 is formed on a semiconductor substrate 100. Concretely, the upper surface of a semiconductor layer 3 is thermally oxidized to form a thermal oxide film 21 on the upper surface of the semiconductor layer 3. Thereafter, the silicon nitride film 22 is formed on the thermal oxide film 21. The film thickness of the thermal oxide film is set to not more than 100 nm, for example. The film thickness of the silicon nitride film 22 is set to approximately 80 to 300 nm, for example.

Subsequently, a resist (not shown) having a predetermined opening pattern is formed on the protection film 25. Using the resist as a mask, part of the silicon nitride film 22 and part of the thermal oxide film 21 is then selectively removed by dry etching process or the like. Thereby, an opening part 22a is formed in the protection film 25 and extends through the direction of thickness thereof, so that the upper surface of the semiconductor layer 3 is partially exposed. The resist is then removed.

Figure 4:
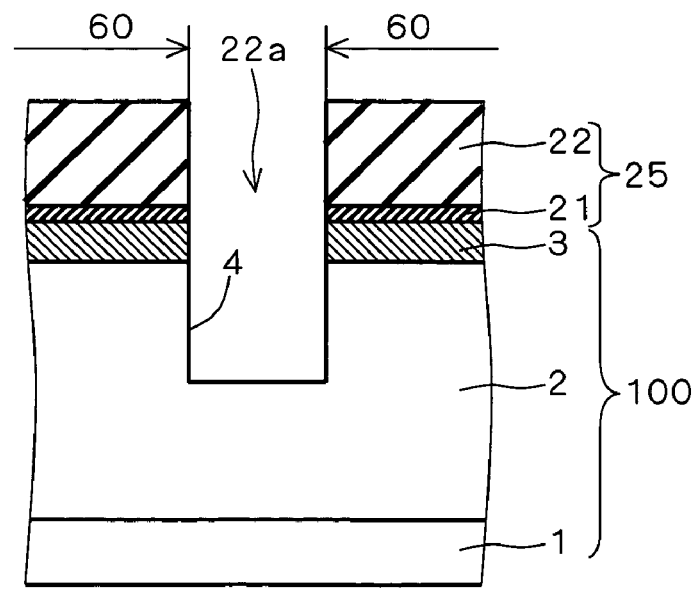

Referring to FIG. 4, by anisotropic dry etching process that has a high etching rate in the thickness direction of the semiconductor substrate 100, the semiconductor layer 3 and a compound semiconductor layer 2 are partially removed using the protection film 25 as a mask. Thereby, the semiconductor substrate 100 exposed by the opening part 22a is partially removed to form a trench 4 in the semiconductor substrate 100. By forming the trench 4 in the semiconductor substrate 100, a plurality of element forming regions 60 are defined in the semiconductor substrate 100. In the anisotropic dry etching process used for forming the trench 4, a mixed gas of chlorine and oxygen is used, for example. The depth of the trench 4 is set to approximately 200 to 400 nm, for example. Here, the depth of the trench 4 changes depending on a minimum isolation width W0. When the minimum isolation width W0 is not more than 140 nm, the depth of the trench 4 is not more than approximately 300 nm.

Since the anisotropic etching process that has a high etching rate in the thickness direction of the semiconductor substrate 100 is used in forming the trench 4, the width of the trench 4 and the width of the opening part 22a are approximately the same.

Figure 5:
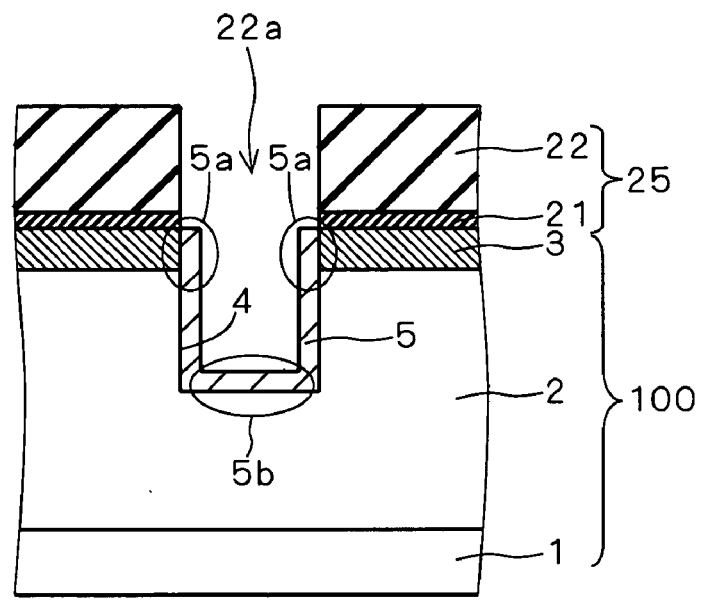

Referring to FIG. 5, a semiconductor film 5 is formed on the surface of the trench 4 by using selective epitaxial growth process. The selective epitaxial growth process employs, as an atmospheric gas, such as $Si_2H_6$ (disilane) or a mixed gas of $Si_2H_6$ and $Cl_2$ (chlorine). For example, the semiconductor film 5 is formed by UHV-CVD process under the conditions that an atmospheric pressure is $1 \times 10^{-2}$ to 1 Pa, and the temperature of the semiconductor substrate 100 is between 500° C. and 700° C.

Instead of UHV-CVD process, other CVD process such as LP-CVD process may be employed. Alternatively, impurities such as boron (B), indium (In), nitrogen (N), phosphorous (P), arsenic (As), and antimony (Sb) may be added to the semiconductor film 5. Further, impurity of the conductive type that is the reverse of the conductivity type of the element forming regions 60 may be introduced by ion implantation process to an upper end part 5a and a bottom part 5b of the semiconductor film 5. This suppress a depletion layer from extending from a source region 51 or a drain region 52 of the MOS transistor 50, which are to be formed in a later step, so that the isolation characteristic of the element isolation structure 10a is improved thereby to improve the performance of the MOS transistor 50.

Figure 6:
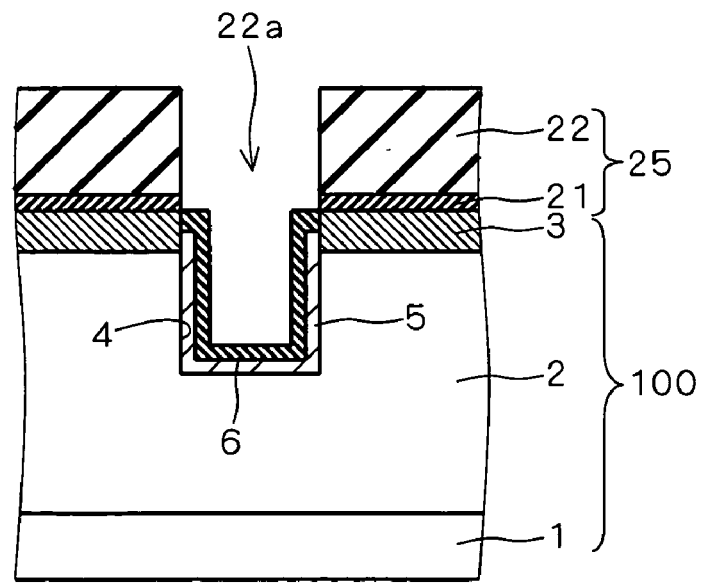

Referring to FIG. 6, the exposed surface of the semiconductor film 5 is thermally oxidized to form an insulating film 6 on the exposed surface of the semiconductor film 5. The film thickness of the insulating film 6 is set to such a value as to avoid that all of the semiconductor film 5 is thermally oxidized thereby to allow the insulating film 6 to enter the semiconductor substrate 100. That is, the thermal oxidation processing of the semiconductor film 5 is carried out under the condition that the semiconductor substrate 100 is not thermally oxidized. In other words, the thermal oxidation processing is carried out under the condition that thermal oxidation proceeds only in the semiconductor film 5. This condition is settable by controlling thermal oxidation time, performing thermal oxidation in a diluted state which is obtained by mixing nitrogen gas into an oxidizing atmosphere, and setting thermal oxidation temperature to a relatively low temperature, and the like. Thus, by limiting the thermally oxidized region to the semiconductor film 5, there is no possibility that the compound semiconductor layer 2 is thermally oxidized, and that the insulating film 6 contacts with the compound semiconductor layer 2.

Since the semiconductor film 5 is so thermally oxidized, the film thickness thereof may be a value at which the above-mentioned thermal oxidation processing is executable. For example, when the isolation width W0 is 100 to 200 nm, the film thickness of the semiconductor film 5 is set to approximately 2 to 70 nm. This is the value obtained by also considering that the film thickness of the insulting film 6 approximately doubles the film thickness of the semiconductor film 5 to be oxidized by thermal oxidation.

Figure 7:
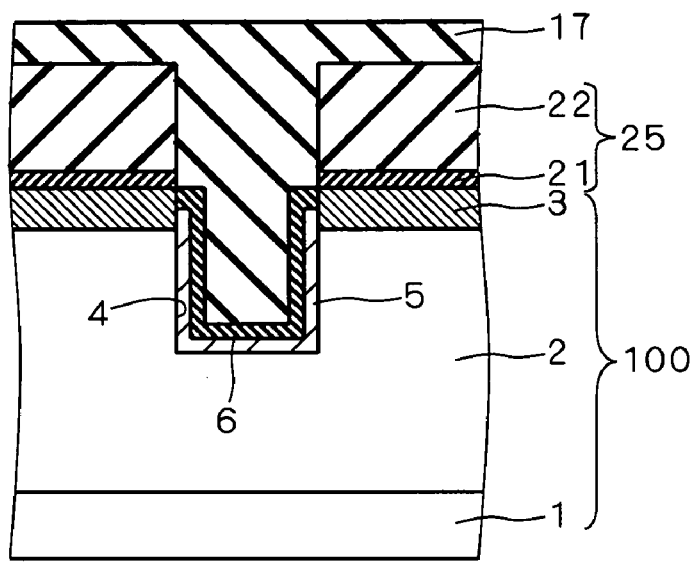

Referring to FIG. 7, a silicon oxide film 17 for filling the trench 4 is formed on the insulating film 6 and the protection film 25. The silicon oxide film 17 is formed by CVD process using TEOS etc. as raw material, or bias CVD process using $SiH_4$ etc. as raw material.

Figure 8:
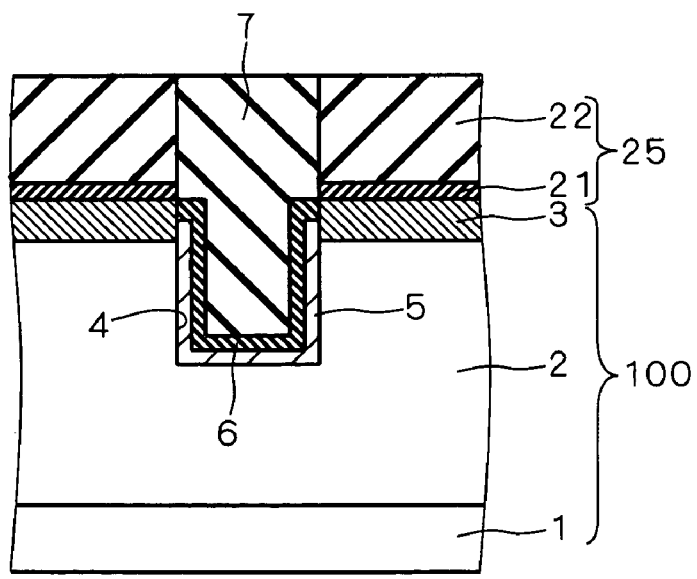

Subsequently, using as a stopper layer the silicon nitride film 22 that is the upper layer of the protection film 25, the silicon oxide film 17 on the upper surface of the protection film 25 is removed by dry etching process, CMP process, or the like. Thereby, as shown in FIG. 8, an insulating film 7, which is composed of the silicon oxide film 17 and fills the trench 4, is formed on the insulating film 6. The upper surface of the insulating film 7 is flat and has approximately the same height as the upper surface of the protection film 25.

Thereafter, the silicon nitride film 22 of the protection film 25 is removed by wet etching process with use of heated phosphoric acid or the like, and the thermal oxide film 21 is removed by wet etching process with use of hydrofluoric acid solution. Subsequently, a well region (not shown), a gate insulting film 54, a source region 51 and a drain region 52, and a gate electrode 53 of a MOS transistor 50 are formed sequentially to form the MOS transistor 50 in each of a plurality of element forming regions 60. This results in the semiconductor device shown in FIGS. 1 and 2.

Thus, in the method for manufacturing a semiconductor device according to the first preferred embodiment, the semiconductor film 5 is thermally oxidized to form the insulating film 6, without thermally oxidizing the compound semiconductor layer 2. Therefore, if an element such as germanium is contained in the compound semiconductor layer 2, it is possible to suppress the element from segregating in the interface between the semiconductor region 80 and the insulator region 90. It is therefore capable of suppressing an increase in the interface state density in the interface between the semiconductor region 80 and the insulator region 90, thereby reducing the leakage current of the MOS transistor 50. It is also capable of suppressing an increase in the fixed charge in the insulating film 6, thereby improving the element isolation characteristic in the semiconductor device.

While the first preferred embodiment describes the case of applying the present invention to the semiconductor device having the strained Si channel MOS transistor, the present invention is also applicable to the semiconductor device having the MOS transistor utilizing the SiGe layer as a channel, as disclosed in the document II, or the semiconductor device having the MOS transistor that utilizes, as a channel, superlattice formed by Si and SiGe, as disclosed in the document III.

Although the SiGe layer is employed as the compound semiconductor layer 2, instead of it, a SiGeC layer, a gallium arsenic (GaAs) layer, or the like may be employed.

Second Preferred Embodiment

Figures 9, 10:
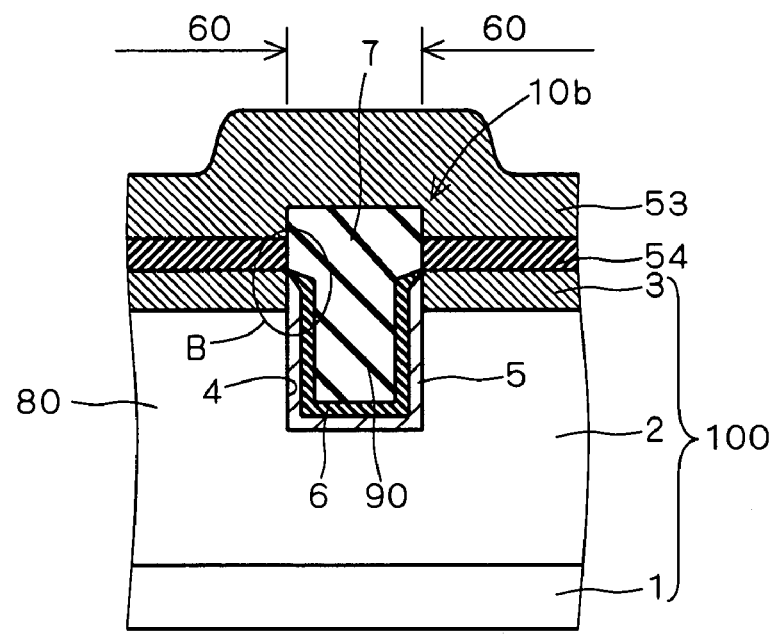
FIGS. 9 to 10 are sectional views showing the structure of a semiconductor device according to a second preferred embodiment of the present invention.

FIG. 9 is a sectional view showing the structure of a semiconductor device according to a second preferred embodiment of the present invention. FIG. 10 is a sectional view showing in enlarged dimension the area B in FIG. 9. The semiconductor device of the second preferred embodiment differs from the semiconductor device of the first preferred embodiment in that an element isolation structure 10*b* is provided instead of the element isolation structure 10*a*. The element isolation structure 10*b* has a semiconductor film 5 and an insulating film 6 that are of different shapes than in the element isolation structure 10*a*. Note that FIG. 9 is a sectional view taken at a location corresponding to the line A—A as indicated by the arrows in FIG. 1.

As shown in FIGS. 9 and 10, the semiconductor film 5 provided on the surface of a trench 4 is in contact with the entire region of the inner surface of a compound semiconductor device 2 that is exposed by a trench 4, and with the entire region of the inner side surface of a semiconductor layer 3 that is exposed by the trench 4. An upper end surface 15 of the semiconductor film 5 forms an inclined surface that is inclined in a direction vertical to the thickness direction of a semiconductor substrate 100, and is continuous with an upper surface 13 of the semiconductor layer 3. An angle θ to be formed by the upper end surface 15 of the semiconductor film 5 and the upper surface 13 of the semiconductor layer 3 is an obtuse angle.

Unlike the first preferred embodiment, the insulating film 6 provided on the semiconductor film 5 is not in contact with the inner side surface of the semiconductor layer 3 exposed by the trench 4. Otherwise, the structure is the same as the semiconductor device of the first preferred embodiment, and description thereof is therefore omitted herein.

Thus, in the semiconductor device of the second preferred embodiment, the upper surface 13 of the semiconductor layer 3 is continuous with the upper end surface 15 of the semiconductor film 5, and the angle θ to be formed therebetween is an obtuse angle. Accordingly, the field from a gate electrode 53 during the operation of a MOS transistor 50 is unlikely to converge at a corner part 11, which is formed at a boundary part with an insulator region 90 in a semiconductor region 80. The reason for this will concretely be described below.

Figure 11:
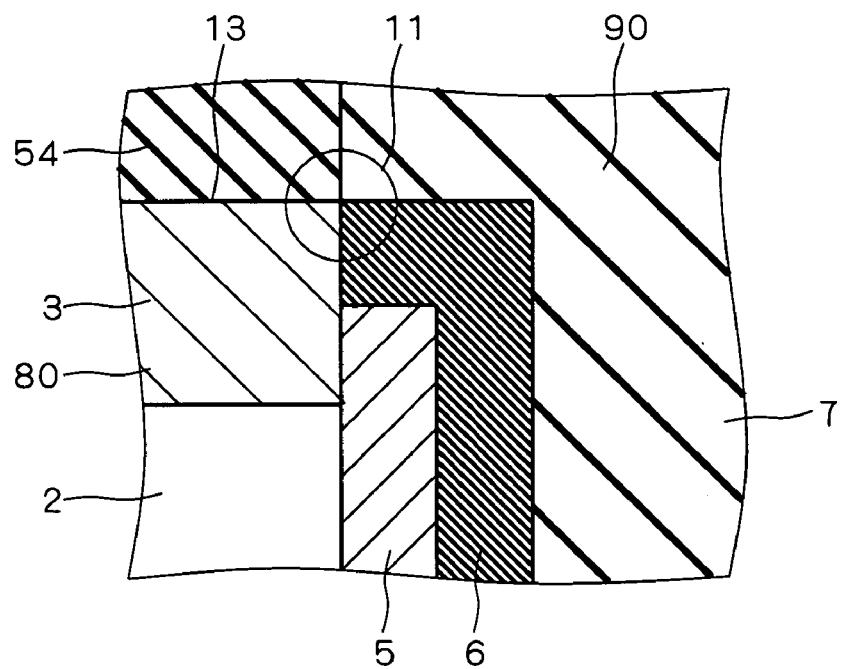
FIG. 11 is a sectional view showing the structure of the semiconductor device of the first preferred embodiment.

FIG. 11 is an enlarged sectional view of the semiconductor device of the first preferred embodiment, which is taken at the location corresponding to the area B in FIG. 9. As shown in FIG. 11, the corner part 11 of the semiconductor region 80 has an angle of 90° in the semiconductor device of the first preferred embodiment. Since the field from the gate electrode 53 is applied from a direction vertical to the surface of the semiconductor region 80, the field is applied to a corner of the corner part 11 from a region forming an angle of 90° (180° minus 90°), with the corner as the summit. Thus, the field from the gate electrode 53 is liable to converge at the corner part 11, so that the leakage current of the MOS transistor 50 might be increased.

Whereas in the second preferred embodiment, the angle θ formed between the upper surface 13 of the semiconductor layer 3 and the upper end surface 15 of the semiconductor film 5 is an obtuse angle, that is, the angle of the corner part 11 is an obtuse angle. Accordingly, the field is applied to a corner of the corner part 11 only from a region forming an angle of (180° minus θ), that is, an angle smaller than 90°, with the corner as the summit. Hence, the field is hard to converge at the corner part 11, thereby further reducing the leakage current of the MOS transistor 50 than in the semiconductor device of the first preferred embodiment.

Figure 12:
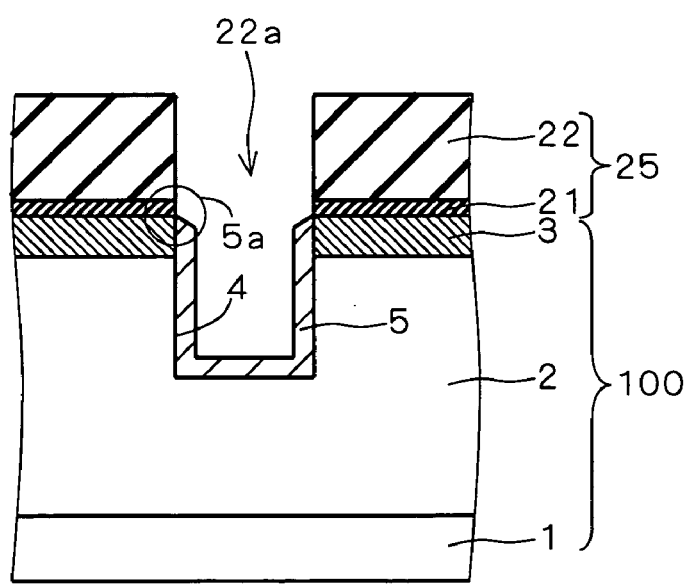
FIGS. 12 and 13 are sectional views showing a method for manufacturing a semiconductor device in the second preferred embodiment.
Figure 13:
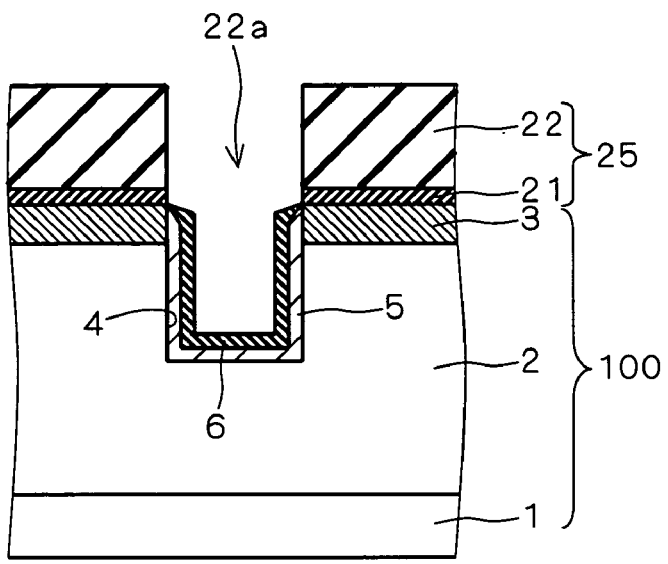

The following is a method for manufacturing the semiconductor device shown in FIGS. 9 and 10. FIGS. 12 and 13 are sectional views showing in the order of the steps a method for forming a semiconductor device according to the second preferred embodiment. Like FIG. 9, they are sectional views taken at the location corresponding to the line A—A as indicated by the arrows in FIG. 1.

First, the structure shown in FIG. 4 is obtained by using the above-mentioned manufacturing method of the first preferred embodiment. Then, as shown in FIG. 12, a semiconductor film 5 is formed on the surface of a trench 4 by using selective epitaxial growth process. At this time, the condition of the selective epitaxial growth process is adjusted such that the plane orientation of crystal in the surface of an upper end part 5*a* of the semiconductor film 5 is different from the plane orientation of crystal in the inner side surface of a semiconductor substrate 100 exposed by the trench 4. For example, an atmospheric pressure is set to $1 \times 10^{-4}$ to $1 \times 10^{-2}$ Pa by changing the flow ratio of a mixed gas of $Si_2H_6$ and $Cl_2$, which is used in the selective epitaxial growth process in the manufacturing method of the first preferred embodiment. Then, setting the temperature of the semiconductor substrate 100 to 700° C. to 800° C., the semiconductor film 5 is formed by UVH-CVD process. Thus, by controlling the flow ratio of atmospheric gas and the temperature of the semiconductor substrate 100, it is capable of forming the semiconductor film 5 having a plane orientation different from the semiconductor substrate 100. As a result, the upper end surface of the semiconductor film 5 becomes an inclined surface.

For example, if the inner side surfaces of the semiconductor layer 3 and the compound semiconductor layer 2, which are exposed by the trench 4, have a plane orientation of (0, 0, 1), it is possible that the surface in the upper end part 5a of the semiconductor film 5 has a (3, 1, 1)-oriented facet.

Like the first preferred embodiment, impurities such as boron, indium, nitrogen, phosphorous, arsenic, and antimony may be added to the semiconductor film 5, or impurity of the conductive type that is the reverse of that of element forming regions 60 may be introduced by ion implantation process.

Referring to FIG. 13, the exposed surface of the semiconductor film 5 is thermally oxidized to form an insulating film 6 on the semiconductor film 5. Then, in the same manner as the manufacturing method of the first preferred embodiment, an insulating film 7 is formed, and a protection film 25 is removed to form a MOS transistor 50. This results in the semiconductor device shown in FIG. 9.

Thus, in the method for manufacturing a semiconductor device of the second preferred embodiment, the angle θ formed between the upper surface of the semiconductor layer 3 and the upper end surface 15 of the semiconductor film 5 can easily be set to an obtuse angle by having the plane orientation in the surface of the upper end part 5a of the semiconductor film 5 be different from the plane orientation in the inner side surface of the semiconductor substrate 100 exposed by the trench 4. Accordingly, the field from a gate electrode 53 is unlikely to converge at a corner part 11 of the semiconductor region 80. This enables to reduce the leakage current of the MOS transistor 50.

Third Preferred Embodiment

Figure 14:
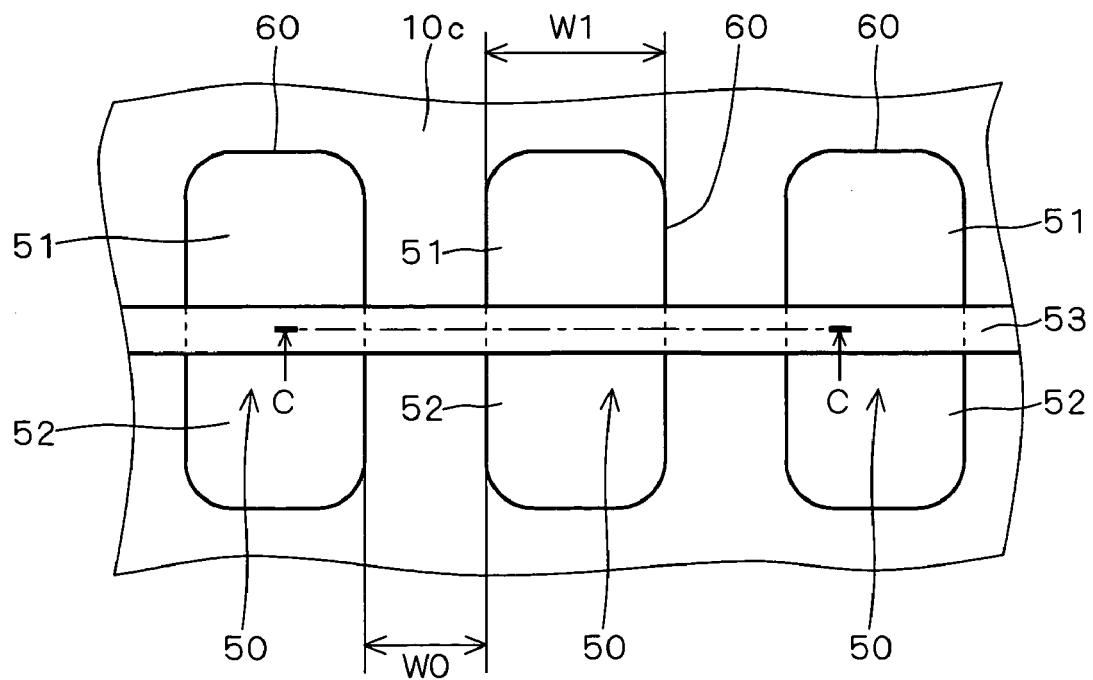
FIG. 14 is a plan view showing the structure of a semiconductor device according to a third preferred embodiment of the present invention.
Figure 15:
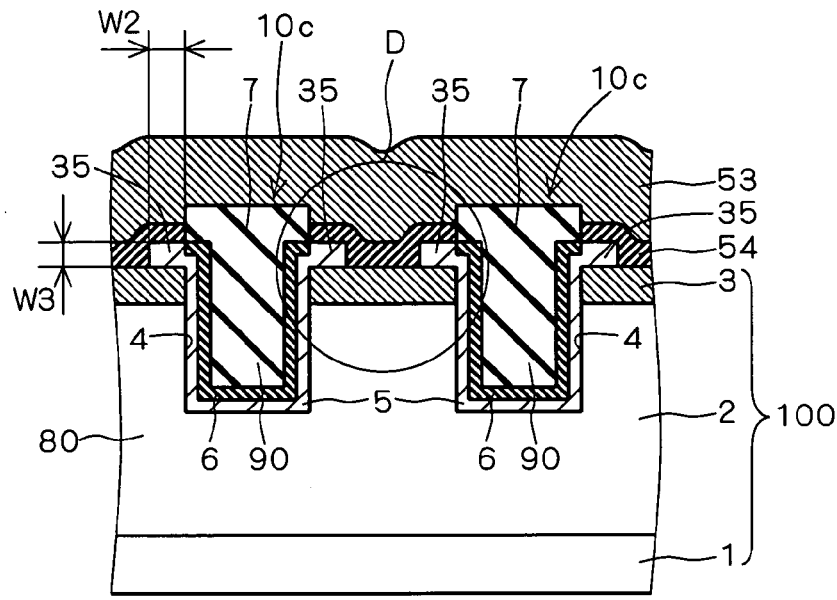
FIGS. 15 and 16 are sectional views showing the structure of the semiconductor device of the third preferred embodiment.
Figure 16:
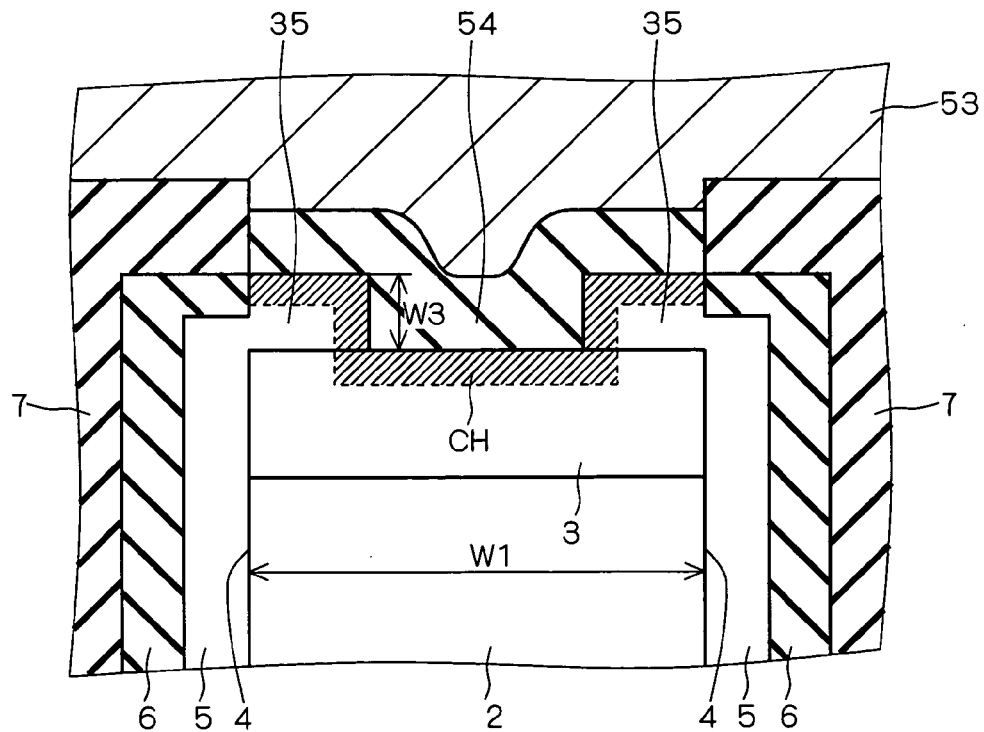

FIG. 14 is a plan view showing the structure of a semiconductor device according to a third preferred embodiment of the present invention. FIG. 15 is a sectional view taken along the line C—C as indicated by the arrows in FIG. 14. FIG. 16 is sectional view showing in enlarged dimension the area D in FIG. 15. In FIG. 14, a semiconductor film 35 is omitted to avoid the complexity of the drawing. A semiconductor device of the third preferred embodiment is basically the same as the semiconductor device of the first preferred embodiment, except that an element isolation structure 10c is provided instead of the element isolation structure 10a, and that the semiconductor film 35 is added. The element isolation structure 10c has a semiconductor film 5 and an insulating film 6 that are of different shapes than in the element isolation structure 10a of the first preferred embodiment.

Referring to FIGS. 14 to 16, a semiconductor film 5 provided on the surface of a trench 4 is in contact with the entire region of the inner surface of a compound semiconductor layer 2 exposed by the trench 4, and also with the entire region of the inner side surface of a semiconductor layer 3 exposed by the trench 4.

The semiconductor film 35 is partially provided on the upper surface of the semiconductor layer 3 in each of element forming regions 60, and connected to the semiconductor film 5. The semiconductor film 35 extends along the peripheral edge of the element forming regions 60, when viewed from above. The semiconductor film 35 is composed of a silicon film, for example, and extends a distance W2 from the semiconductor film 5 to the element forming regions 60. A film thickness W3 of the semiconductor film 35 is set to 2 to 70 nm, for example. Unlike the first preferred embodiment, an insulting film 6 provided on the semiconductor film 5 is not in contact with the inner side surface of the semiconductor layer 3 exposed by the trench 4.

A gate insulating film 54 of a MOS transistor 50 is provided in part, at which the semiconductor film 35 is not provided, in the upper surface of the semiconductor layer 3 between a source region 51 and a drain region 52. The gate insulating film 54 is also partially provided on the upper surface and the side surface of the semiconductor film 35. A gate electrode 53 is provided on the gate insulating film 54. Otherwise, the structure is the same as that of the semiconductor device of the first preferred embodiment, and description thereof is therefore omitted herein.

Like the semiconductor layer 3, the semiconductor film 35 also has tensile strain, and functions as a channel of the MOS transistor 50. As shown in FIG. 16, when the MOS transistor 50 is operated by applying a predetermined voltage to the gate electrode 53, a channel region CH is formed in the semiconductor film 35 and the semiconductor layer 3. The channel region CH is formed along the upper surface and the side surface of the semiconductor film 35, and along the upper surface of the semiconductor layer 3. Since the semiconductor film 35 extends along the peripheral edge of the element forming regions 60, when viewed from above, the effective channel width of the MOS transistor 50 can be made longer than a design channel width W1 by the amount of twice a film thickness W3 of the semiconductor film 35. In other words, the channel region CH can be increased by the amount of the side surface of the semiconductor film 35 in contact with the gate insulating film 54.

Thus, in the semiconductor device of the third preferred embodiment, the gate insulating film 54 of the MOS transistor 50 is also provided on the side surface of the semiconductor film 35. It is therefore possible to increase the channel region CH by the amount of the side surface of the semiconductor film 35 in contact with the gate insulating film 54. Since the current amount in the channel region CH of the MOS transistor 50 is proportion to the size of the channel region CH, the driving capability of the MOS transistor 50 can be improved.

Figure 17:
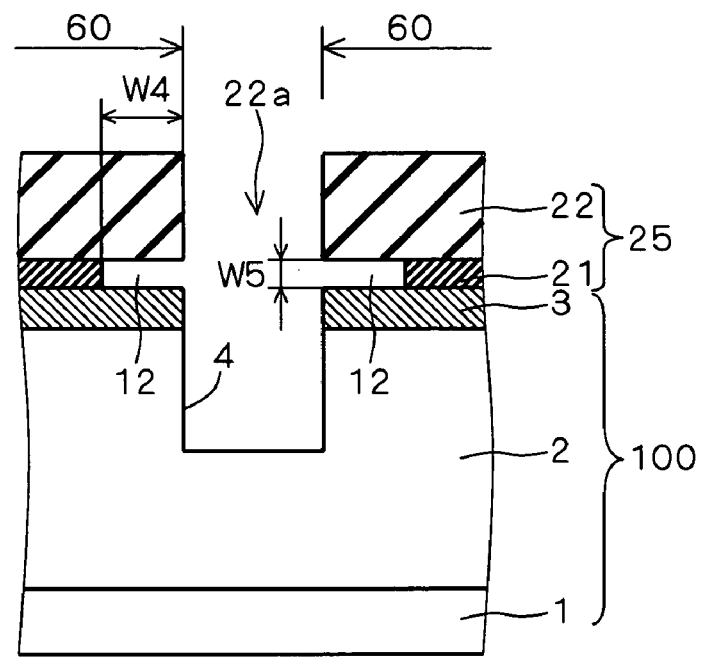
FIGS. 17 to 19 are sectional views showing a method for manufacturing a semiconductor device in the third preferred embodiment.
Figure 18:
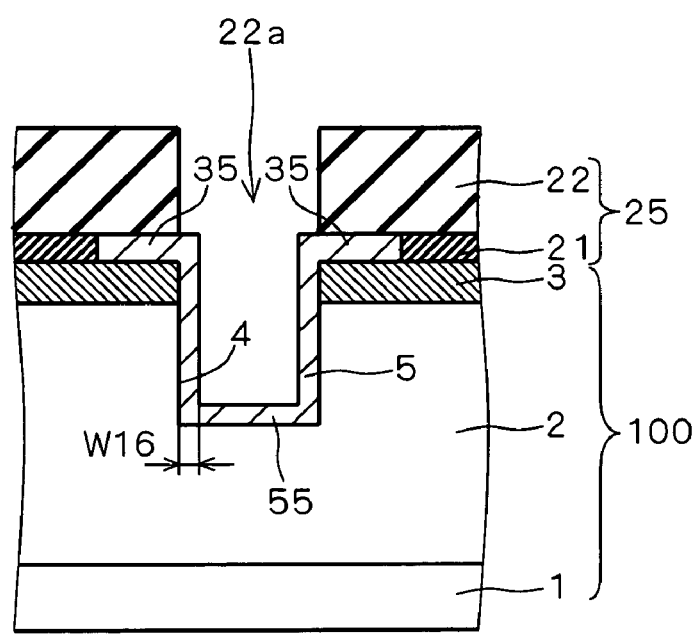
Figure 19:
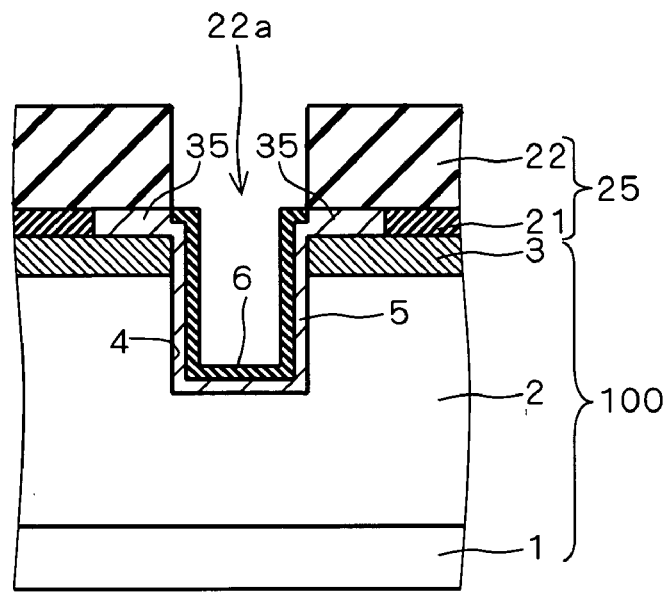

The following is a method for manufacturing the semiconductor device shown in FIGS. 14 to 16. FIGS. 17 to 19 are sectional views taken at the location corresponding to the line A—A as indicated by the arrows in FIG. 1, showing in the order of the steps the method for manufacturing the semiconductor device according to the third preferred embodiment.

First, the structure shown in FIG. 4 is obtained by using the above-mentioned manufacturing method of the first preferred embodiment. Then, as shown in FIG. 17, by wet etching process using hydrofluoric acid solution or the like, a thermal oxide film 21 is selectively etched so as to partially remove the thermal oxide film 21 exposed by an opening part 22a. Thereby, a hole 12 in communication with the opening part 22a is formed in a protection film 25, so that the upper surface of a semiconductor layer 3 in element forming regions 60 is partially exposed by the hole 12. At this time, a width W4 of the hole 12 in a direction from the opening part 22a to the element forming regions 60 is adjustable by controlling the etching time of the wet etching.

A film thickness W5 of the thermal oxide film 21 is approximately 2 to 70 nm, for example. The height of the hole 12 is determined by the film thickness W5 of the thermal oxide film 21. That is, the height of the hole 12 is the same as the film thickness W5 of the thermal oxide film 21.

Referring to FIG. 18, by selective epitaxial growth process as in the first preferred embodiment, a silicon film 55 is formed on the upper surface of the semiconductor layer 3 exposed by the hole 12, and on the surface of the trench 4. At this time, the hole 12 is filled with a silicon film 55 by increasing a film thickness W16 of the silicon film 55 than the film thickness W5 of the thermal oxide film 21. Thus, the hole 12 is filled to complete the semiconductor film 35 composed of the silicon film 55. At the same time, there is completed the semiconductor film 5 that is provided on the trench 4 and composed of the silicon film 55. At this time, the above-mentioned distance W2 matches the width W4 of the hole 12, and the film thickness W3 of the semiconductor film 35 matches the film thickness W5 of the thermal oxide film 21. Like the first preferred embodiment, impurities such as boron, indium, nitrogen, phosphorous, arsenic, and antimony may be added to the semiconductor films 5 and 35, or impurity of the conductive type that is the reverse of that of the element forming regions 60 may be introduced to the semiconductor film 5 by ion implantation process.

Referring to FIG. 19, the exposed surface of the semiconductor film 5 is thermally oxidized to form an insulating film 6 on the semiconductor film 5. Then, in the same manner as the manufacturing method of the first preferred embodiment, an insulating film 7 is formed, and a MOS transistor 50 is formed after removing a protection film 25. At this time, the gate insulting film 54 of the MOS transistor 50 is also formed on the upper surface and the side surface of the semiconductor film 35. This results in the semiconductor device shown in FIGS. 14 to 16.

Thus, in the method for manufacturing a semiconductor device of the third preferred embodiment, the gate insulating film 54 of the MOS transistor 50 is also formed on the side surface of the semiconductor film 35 on the semiconductor layer 3. Therefore, the channel region of the MOS transistor 50 can be increased by the amount of the side surface of the semiconductor film 35 in contact with the gate insulating film 54. This enables to improve the driving capability of the MOS transistor 50.

Although the silicon film 55 for filling the hole 12 is formed in the third preferred embodiment, the hole 12 may not completely be filled with the silicon film 55 by decreasing the film thickness W16 of the silicon film 55 than the film thickness W5 of the thermal oxide film 21. In this case, the upper surface of the semiconductor film 35 is also thermally oxidized when forming the insulting film 6. Therefore, the film thickness W3 of the semiconductor film 35 at the completion of the semiconductor device is decreased by the amount consumed during the thermal oxidation, than the film thickness of the semiconductor film 35 immediately after the formation thereof, namely, the film thickness W16 of the silicon film 55.

Fourth Preferred Embodiment

FIGS. 20 to 23 are sectional views taken at the location corresponding to the line A—A as indicated by the arrows in FIG. 1, showing in the order of the steps a method for manufacturing a semiconductor device according to a fourth preferred embodiment of the present invention. The manufacturing method of the fourth preferred embodiment will be described below by referring to FIGS. 20 to 23.

Figure 20:
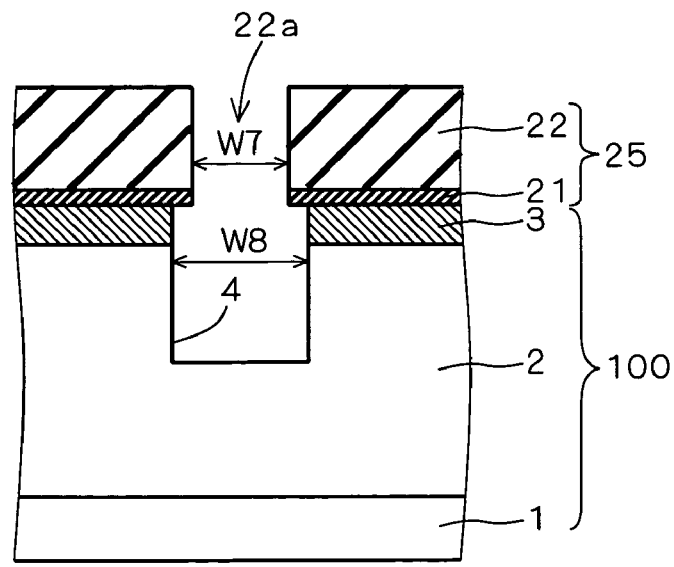

First, the structure shown in FIG. 4 is obtained by using the above-mentioned manufacturing method of the first preferred embodiment. Referring to FIG. 20, using a protection film 25 as a mask, a semiconductor substrate 100 exposed by a trench 4 is etched by isotropic wet etching process. Thereby, a semiconductor layer 3 and a compound semiconductor layer 2, which are exposed by the trench 4, are partially removed to increase the depth and the width of the trench 4, so that a width W8 of the trench 4 after the isotropic etching is greater than a width W7 of an opening part 22a. That is, the trench 4 wider than the opening part 22a is formed in the semiconductor substrate 100. In this isotropic wet etching, an ammonia-hydrogen peroxide solution is used for example.

Figure 21:
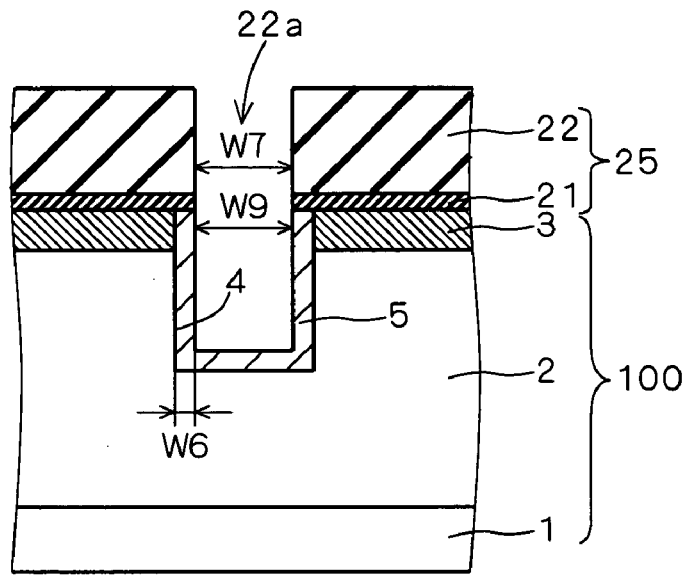

Referring to FIG. 21, in the same manner as the manufacturing method of the first preferred embodiment, a semiconductor film 5 is formed on the surface of the trench 4 by using selective epitaxial growth process. At this time, by adjusting a film thickness W6 of the semiconductor film 5, a distance W9 between the inner side surfaces opposed to each other in the semiconductor film 5 is set to the same as the width W7 of the opening part 22a. Like the first preferred embodiment, impurities such as boron, indium, nitrogen, phosphorous, arsenic, and antimony may be added to the semiconductor film 5, or impurity of the conductive type that is the reverse of that of the element forming regions 60 may be introduced by ion implantation process.

Figure 22:
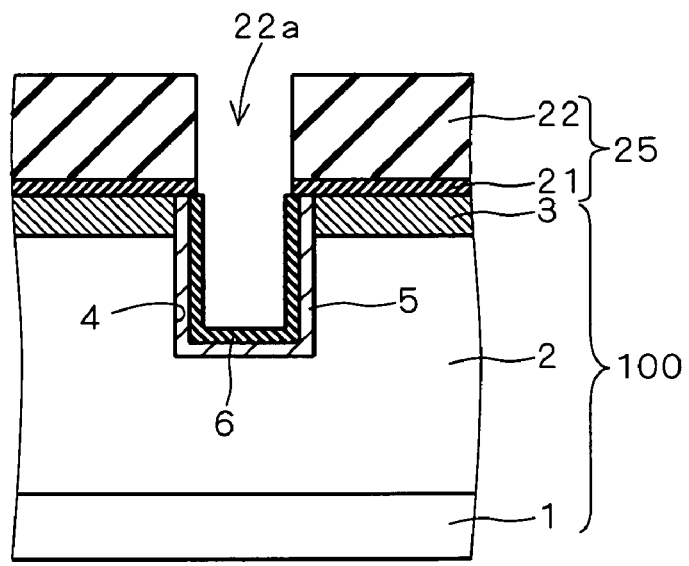
Figure 2:
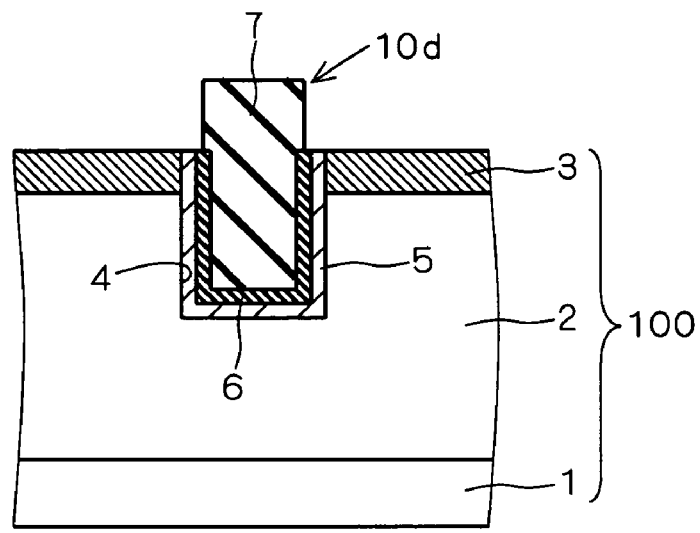
Figure 2:
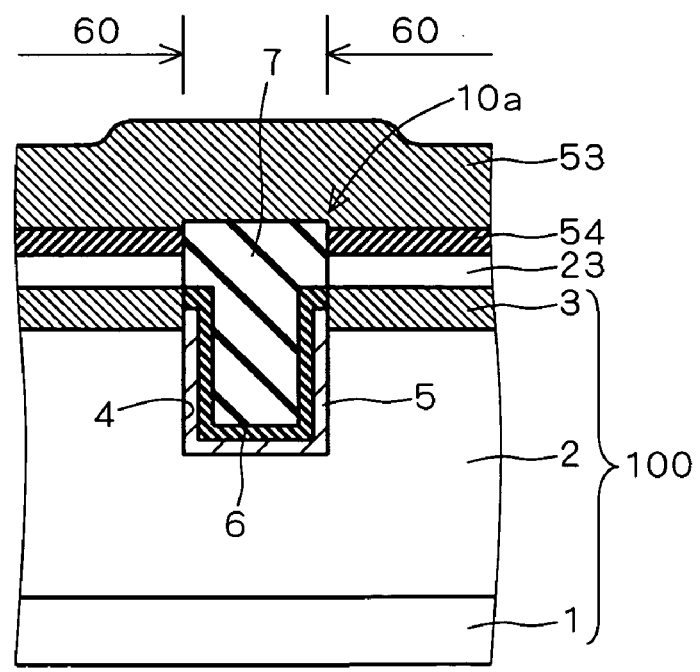

Referring to FIG. 22, in the same manner as the manufacturing method of the first preferred embodiment, the exposed surface of the semiconductor film 5 is thermally oxidized to form an insulating film 6 on the semiconductor film 5. Referring to FIG. 23, an insulating film 7 for filling the trench 4 is formed on the insulating film 6, and a protection film 25 is then removed, thereby completing an element isolation structure 10d consisting of the trench 4, the semiconductor film 5, and the insulating films 6 and 7. Thereafter, a MOS transistor 50 is formed in the same manner as the manufacturing method of the first preferred embodiment.

Thus, in the method for manufacturing a semiconductor device of the fourth preferred embodiment, after forming the trench 4 by anisotropic etching to the semiconductor substrate 100, isotropic etching is performed to the semiconductor substrate 100 exposed by the trench 4. Therefore, the width W8 of the trench 4 of the element isolation structure 10d can be made greater than the width W7 of the opening part 22a of the protection film 25. Even if the width W7 of the opening part 22a of the protection film 25 cannot previously be made large because of constraint such as design rule, the width W8 of the trench 4 can be made greater than the width W7 of the opening part 22a, thereby facilitating to fill the trench 4 with the insulating film 7. This enables to suppress element isolation characteristic from degrading because the trench 4 is not completely filled with the insulting film 7.

Fifth Preferred Embodiment

FIG. 24 is a sectional view taken at the location corresponding to the line A—A as indicated by the arrows in FIG. 1, showing the structure of a semiconductor device according to a fifth preferred embodiment of the present invention. The semiconductor device of the fifth preferred embodiment is basically the same as the first preferred embodiment, except that a semiconductor film 23 is added.

The semiconductor film 23 is composed of a silicon film, for example, and provided on the upper surface of a semiconductor layer 3 in each of element forming regions 60. A source region 51 and a drain region 52 of a MOS transistor 50 are provided in the semiconductor film 23 and a semiconductor substrate 100. The source region 51 and the drain region 52 extend through the semiconductor film 23 and the semiconductor layer 3, and reach the inside of a compound semiconductor layer 2. A gate electrode 53 of the MOS transistor 50 is formed, via a gate insulating film 54, on the upper surface of the semiconductor film 23, which is sandwiched by the source region 51 and the drain region 52. The gate electrode 53 is also provided on an element isolation structure 10*a* between the element forming regions 60.

Like the semiconductor layer 3, the semiconductor film 23 has tensile strain, and functions as a channel of the MOS transistor 50 together with the semiconductor layer 3. Otherwise, the structure is the same as the semiconductor device of the first preferred embodiment, and description thereof is therefore omitted herein.

Thus, in the semiconductor device of the fifth preferred embodiment, the semiconductor film 23 is provided on the upper surface of the semiconductor layer 3 in the element forming regions 60. Therefore, even if the thickness of the semiconductor layer 3 is reduced in the step of manufacturing the element isolation structure 10*a*, the semiconductor film 23 can compensate for its decrement.

Since the upper surface of the semiconductor layer 3 is thermally oxidized to form a thermal oxide film 21 of a protection film 25, as described in the first preferred embodiment, the thickness of the semiconductor layer 3 is reduced than that before forming the thermal oxide film 21. It can be considered to increase the thickness of the semiconductor layer 3 by providing allowance for such a decrement. However, no further increase in the thickness of the semiconductor layer 3 is possible because there exists film thickness condition, being called "critical film thickness," under which a strained Si layer is formed without causing any defect.

If the amount of strain is increased in order to improve the mobility of holes or electrons, the above-mentioned critical film thickness tends to decrease. Therefore, an improvement in mobility conflicts with an increase in the thickness of the semiconductor layer 3. Hence, if the amount of strain of the semiconductor layer 3 is increased to improve the mobility, the critical film thickness is decreased, failing to increase the thickness of the semiconductor layer 3. In this situation, if the thickness of the semiconductor layer 3 decreases in the step of forming the element isolation structure 10*a*, the thickness of the semiconductor layer 3 is insufficient when forming the source region 51 and the drain region 52, and the gate electrode 53 of the MOS transistor 50. This might deteriorate the performance of the MOS transistor 50.

Whereas in the fifth preferred embodiment the semiconductor film 23 can compensate for the decrement in the thickness of the semiconductor layer 3. Therefore, the thickness of a semiconductor region formed by the semiconductor layer 3 and the semiconductor film 23 can be increased up to the critical film thickness. This ensures a sufficient channel of the MOS transistor 50, thereby avoiding deterioration in the performance of the MOS transistor 50.

Figure 25:
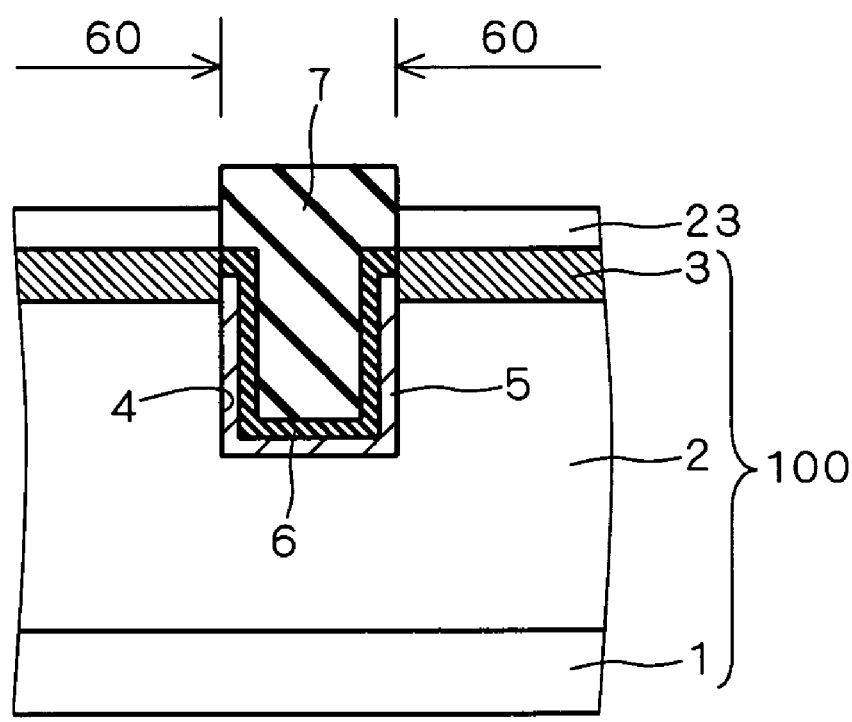
FIG. 25 is a sectional view showing a method for manufacturing a semiconductor device in the fifth preferred embodiment.

The following is a method for manufacturing the semiconductor device shown in FIG. 24. Like FIG. 24, FIG. 25 is a sectional view taken at the location corresponding to the line A—A as indicated by the arrows in FIG. 1, showing a method for manufacturing a semiconductor device according to the fifth preferred embodiment.

First, with the manufacturing method of the first preferred embodiment, the structure shown in FIG. 8 is obtained, and a protection film 25 is then removed. By selective epitaxial growth process under the same condition as in forming the semiconductor film 5, a semiconductor film 23 is formed on the upper surface of a semiconductor layer 3 in element forming regions 60. Subsequently, a well region (not shown), a gate insulating film 54, a source region 51 and a drain region 52, and a gate electrode 53 are formed sequentially, so that a MOS transistor 50 is formed in each of the element forming regions 60. This results in the semiconductor device shown in FIG. 24.

Thus, in the method for manufacturing a semiconductor device in the fifth preferred embodiment, after the element isolation structure 10*a* is formed, the semiconductor film 23 is formed on the upper surface of the semiconductor layer 3. Even if the thickness of the semiconductor layer 3 decreases during the step of manufacturing the element isolation structure 10*a*, the semiconductor layer 23 can compensate for its decrement. Therefore, the thickness of a semiconductor region formed by the semiconductor layer 3 and the semiconductor film 23 can be increased up to the critical film thickness. This ensures a sufficient channel of the MOS transistor 50, thereby preventing deterioration in the performance of the MOS transistor 50.

Although in the fifth preferred embodiment, the formation of the semiconductor film 23 is prior to the formation of the well region of the MOS transistor 50, it may be performed after forming the well region. Alternatively, the semiconductor film 23 may have a two-layer structure and be formed on the upper surface of the semiconductor layer 3 before and after forming the well region of the MOS transistor 50.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
   a semiconductor substrate having a compound semiconductor layer and a semiconductor layer being provided on said compound semiconductor layer and forming heterojunction with said compound semiconductor layer;
   an element isolation structure being provided in said semiconductor substrate and defining an element forming region in said semiconductor substrate; and
   a semiconductor element provided in said element forming region;
   wherein said element isolation structure has:
      a trench extending through said semiconductor layer in the direction of thickness thereof and extending into the inside of said compound semiconductor layer;
      a first semiconductor film provided on a surface of said trench;
      a first insulating film provided on said first semiconductor film; and
      a second insulating film being provided on said first insulating film and filling said trench;
   wherein an upper surface of said semiconductor layer is continuous with an upper end surface of said first semiconductor film, and an angle formed therebetween is an obtuse angle,
   wherein said semiconductor element is a MOS transistor, and wherein a gate electrode of said MOS transistor is located on said semiconductor layer and said element isolation structure in said element forming region.

2. A semiconductor device comprising:

a semiconductor substrate having a compound semiconductor layer and a semiconductor layer being provided on said compound semiconductor layer and forming heterojunction with said compound semiconductor layer;

an element isolation structure being provided in said semiconductor substrate and defining an element forming region in said semiconductor substrate; and a semiconductor element provided in said element forming region;

wherein said element isolation structure has:
- a trench extending through said semiconductor layer in the direction of thickness thereof and extending into the inside of said compound semiconductor layer;
- a first semiconductor film provided on a surface of said trench;
- a first insulating film provided on said first semiconductor film; and
- a second insulating film being provided on said first insulating film and filling said trench;

the semiconductor device further comprising a second semiconductor film being partially provided on an upper surface of said semiconductor layer in said element forming region and connected to said first semiconductor film of said element isolation structure, wherein said semiconductor element is a MOS transistor, and a gate insulating film of said MOS transistor is provided on an upper surface and a side surface of said second semiconductor film.

3. A semiconductor device comprising:

a semiconductor substrate having a compound semiconductor layer and a semiconductor layer being provided on said compound semiconductor layer and forming heterojunction with said compound semiconductor layer;

an element isolation structure being provided in said semiconductor substrate and defining an element forming region in said semiconductor substrate; and a semiconductor element provided in said element forming region;

wherein said element isolation structure has:
- a trench extending through said semiconductor layer in the direction of thickness thereof and extending into the inside of said compound semiconductor layer;
- a first semiconductor film provided on a surface of said trench;
- a first insulating film provided on said first semiconductor film; and
- a second insulating film being provided on said first insulating film and filling said trench;

the semiconductor device further comprising a second semiconductor film provided on an upper surface of said semiconductor layer in said element forming region.

* * * * *

UNITED STATES PATENT AND TRADEMARK OFFICE
CERTIFICATE OF CORRECTION

PATENT NO. : 7,170,109 B2 Page 1 of 1
APPLICATION NO. : 10/864457
DATED : January 30, 2007
INVENTOR(S) : Kohei Sugihara et al.

It is certified that error appears in the above-identified patent and that said Letters Patent is hereby corrected as shown below:

TITLE PAGE,
    Item "(75) Inventors:", change the fourth-listed inventor's name from "Takahashi Hayashi" to -- Takashi Hayashi --.

Signed and Sealed this

Twenty-ninth Day of May, 2007

JON W. DUDAS
*Director of the United States Patent and Trademark Office*